United States Patent [19]

Brown

[11] Patent Number: 5,044,506
[45] Date of Patent: Sep. 3, 1991

[54] EQUIPMENT SHELF

[75] Inventor: David C. Brown, Belleville, Canada

[73] Assignee: Northern Telecom Limited, Montreal, Canada

[21] Appl. No.: 494,072

[22] Filed: Mar. 15, 1990

[51] Int. Cl.⁵ .............................................. A47G 19/08
[52] U.S. Cl. ........................................ 211/41; 211/26; 361/415
[58] Field of Search ...................... 211/41, 26; 361/415

[56] References Cited

U.S. PATENT DOCUMENTS

| | | | |
|---|---|---|---|
| 3,714,513 | 1/1973 | Marconi | 211/41 X |
| 4,327,835 | 5/1982 | Leger | 211/41 |
| 4,508,228 | 4/1985 | Erlam | 211/41 |
| 4,602,829 | 7/1986 | De Andrea | 361/415 |
| 4,750,088 | 6/1988 | Friot | 211/41 X |
| 4,779,744 | 10/1988 | Shely et al. | 211/41 |

Primary Examiner—Carl D. Friedman
Assistant Examiner—Daniel Hulseberg
Attorney, Agent, or Firm—J. E. Moorhouse

[57] ABSTRACT

An equipment shelf, for removably retaining circuit boards at selectably spaced locations in a system, includes side panels being connected in a spaced relationship one with another by extruded aluminum cross connecting members. A board slider retaining element in the form of an elongated polycarbonate strip is laterally and removably disposed in each cross connecting member. Each strip defines fastening locations, mounting orifices, being arranged in a predetermined pattern. Each of a plurality of board sliders is longitudinally fixed between a pair of the fastening locations, so that lateral spacings of circuit board positions in the equipment shelf are defined by the fastening locations. Lateral spacings of circuit board locations for a system are conveniently selectable by manufacture or choice of polycarbonate strips with an appropriate arrangement of the mounting orifices.

10 Claims, 5 Drawing Sheets

EQUIPMENT SHELF

FIELD OF THE INVENTION

The invention is in the field of large electronic systems and pertains to the orderly housing and retaining of electrical and electronic circuit assemblies in an operable system and more particularly the invention is concerned with an equipment shelf which is expediently adaptable to retaining circuit boards peculiar to a plurality of system variations or models.

BACKGROUND OF THE INVENTION

Over the last decade or so, large electronic systems such as telephone switching facilities or main frame computers and the like, have demonstrated a convergence of technologies. Likewise these apparatus have been taking on a general sameness of appearance, particularly in the retainment of circuit board elements. Each of the systems of interest is characterized by an equipment shelf having card sliders being arranged in parallel one with another, in a row, for receiving edge surfaces of a plurality of circuit boards. A circuit board is typically of about one square foot in area and is electrically or optically connected into the system by interconnecting conductors carried by a back plane at one side of the equipment shelf. Equipment shelves, which at a glance may appear to be similar, have remained distinct because of design variations in circuit board widths which of course dictate like differences in the lateral spacing of the circuit board sliders. Distinct variations in system capacities and features often dictate similar variations in the physical arrangement of circuit boards of various widths in each equipment shelf.

It has been common practice to manufacture a basic design of equipment shelf with variable or adaptable spacing being provided by a multitude of closely spaced mounting orifices, so that virtually any combinations of lateral spacing requirements could be provided for by selective placement of plastic card sliders However, it has been realized that this arrangement is prone to permitting misplaced installation of card sliders, and in some production line environments, it has been found to encourage thoughtless insertion of card sliders at every possible location. Such practice necessitates subsequent correction before circuit boards or units can be inserted into the system. Of course correction includes the removal of any misplaced card sliders from those locations where they had been fastened. Such insertion and subsequent removal is accompanied by abrasion or wearing of the plastic card slider such that if the card slider were to be reused at some other location, the degree of interference with the mounting orifices is reduced. Hence reliability of fastening cannot be relied upon and immediate disposal of any removed card sliders is preferable to avoid any confusion between new and used card sliders at the manufacturing facility.

An alternate practice has been that of providing only the mounting orifices peculiar to the particular equipment shelf. The mounting orifices are formed within cross connecting members in the structure. The typical equipment shelf is usually constructed from several piece parts which are peculiar to the equipment shelf. It is the dimensions and assemble of the piece parts which define the particular characteristics of the shelf. As such, a manufacturer which is in the process of manufacturing several such electronic systems, at the same time, must require an extensive inventory of piece parts for manufacturing all of the different equipment shelves. Many of the piece parts are the cross connecting members which differ only in the location and number of the mounting orifices but nonetheless contribute to the stocking of a large and expensive inventory. Some manufacturers have found that fool proof avoidance of misplaced and or unreliably secured card sliders is worth the additional expense.

It is an object of the invention to reduce the expense of inventory associated with the variety and number of piece parts typically required for the manufacture of various equipment shelves used in some electronic systems.

SUMMARY OF THE INVENTION

In accordance with the invention, an equipment shelf, for removably retaining circuit boards at selectably spaced locations in a system, includes a circuit board cage with side panels being connected in a spaced relationship one with another by upper and lower members. Each of the upper and lower members carries a removably fixed fastening element with fastening locations being arranged in a predetermined pattern. Each of a plurality of board sliders is longitudinally fixed between a pair of the fastening locations, so that lateral spacings of circuit board positions in the equipment shelf are defined by the fastening locations. Hence, spacings of circuit board locations are conveniently selectable by choice of appropriate ones of fastening elements, during assembly of the side panels with the upper and lower members.

In one example, an equipment shelf includes a plurality of board slides, each having an elongated body with a groove in one side thereof, for receiving an edge of a circuit board, and a plurality of attachment projections extending from another side thereof. The board slides are grouped in pairs, each for slidably engaging opposite edges of a circuit board. The board slides are each fixedly engaged by fastening means. Each of the fastening means is an elongated flat strip, being bounded by edges including a pair of parallel longitudinal edges with a plurality of orifices arranged in a row between said longitudinal edges. The orifices are separated one from the other by a predetermined amount and each of the orifices is of an interference fit dimension for retaining one of the attachment projections therein. First and second side panels are spaced apart by a plurality of elongated cross connecting members. Each elongated cross connecting member includes a body portion terminating at first and second ends and a plurality of retaining means. Each retaining means includes a longitudinal channel extending along a side of its body portion between the first and second ends. The longitudinal channel is defined by a pair of side surfaces being connected by a bottom surface, with each of the pair of side surfaces having a groove therein being spaced a predetermined distance from the bottom surface, for slidably receiving a longitudinal edge of one of the fastening means. One pair of the elongated cross connecting members is fixed at the first ends to the first side panel along a first line and at the second ends to the second side panel along a line similar to the first line, and another pair of the elongated cross connecting members is fixed at the first ends to the first side panel along a second line spaced apart from the first line and is fixed at the second ends to the second side panel along a line similar to the second line. Hence circuit board positions in the equipment shelf are determined by the pattern of orifices in the respective flat strips, an appropriate pattern being selectable for each shelf at a time convenient during production of the system.

BRIEF DESCRIPTION OF THE DRAWINGS

An example of an equipment shelf is discussed with reference to the accompanying drawings, in which:

FIG. 9b is an enlarged partial view of one corner of FIG. 9a.

DESCRIPTION OF THE PREFERRED EMBODIMENT

Figure 1:
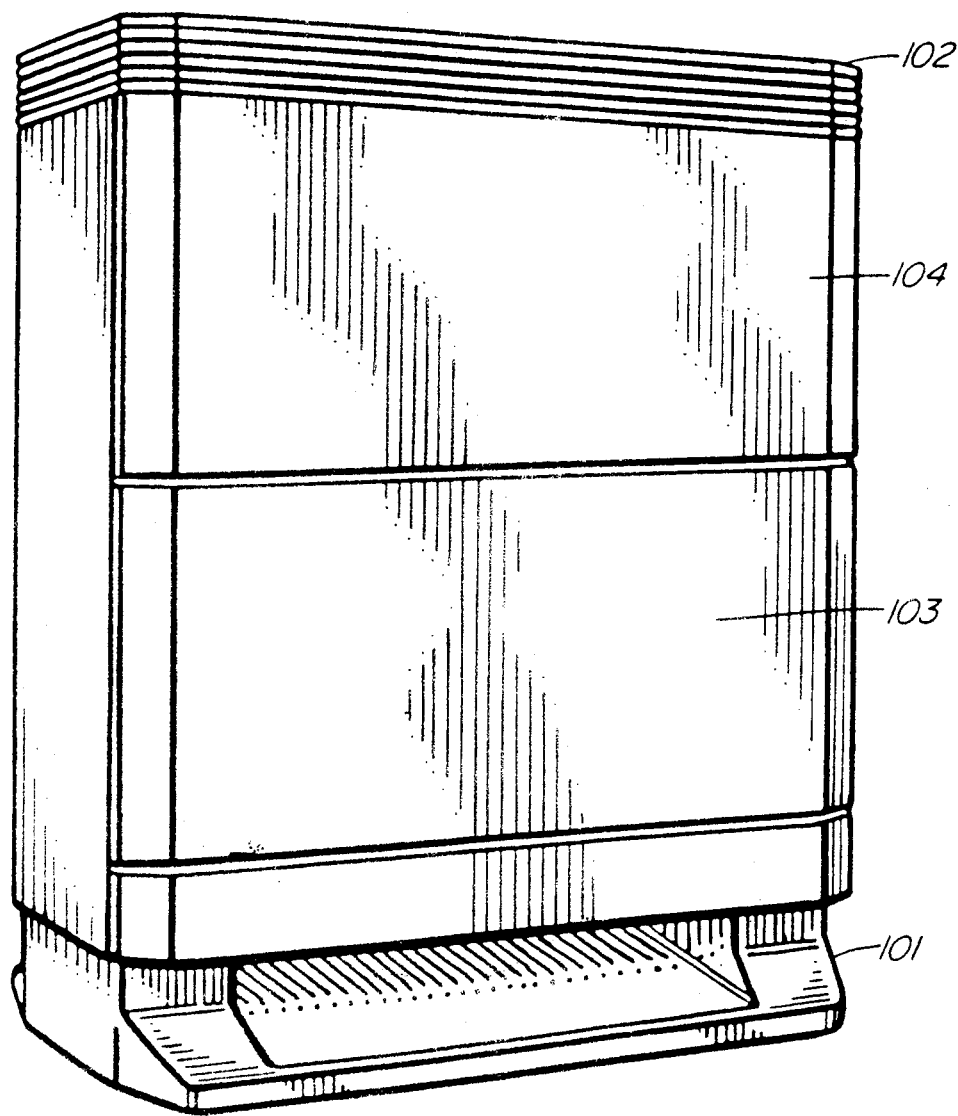
FIG. 1 is a perspective view of an equipment cabinet suitable for housing a telecommunications switching system.
Figure 2:
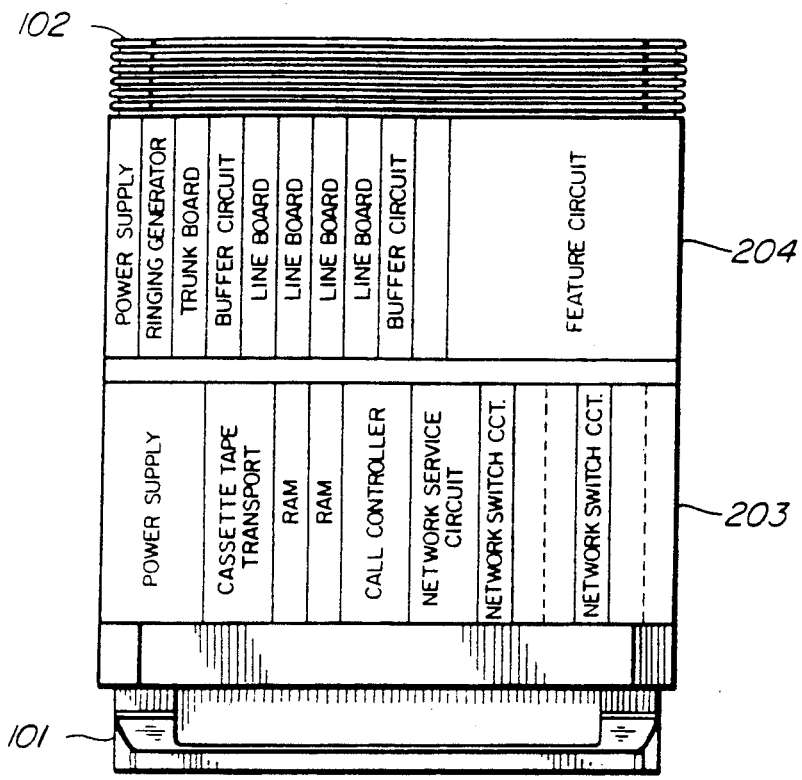
FIG. 2 is a block schematic diagram illustrating one of many possible examples of typical physical circuit locations within upper and lower equipment shelves in the equipment cabinet illustrated in FIG. 1.

Referring to FIG. 1, the equipment cabinet includes a pedestal 101 which carries lower and upper equipment shelves underneath a louvered cap 102. The lower and upper equipment shelves are hidden behind lower and upper covers 103 and 104. The system illustrated in FIG. 2 shows the lower and upper equipment shelves 203 and 204 being occupied by a combination of circuit units of various lateral dimensions for performing various functions, as labeled, to provide an operating system in accordance with a particular specification.

Figure 3:
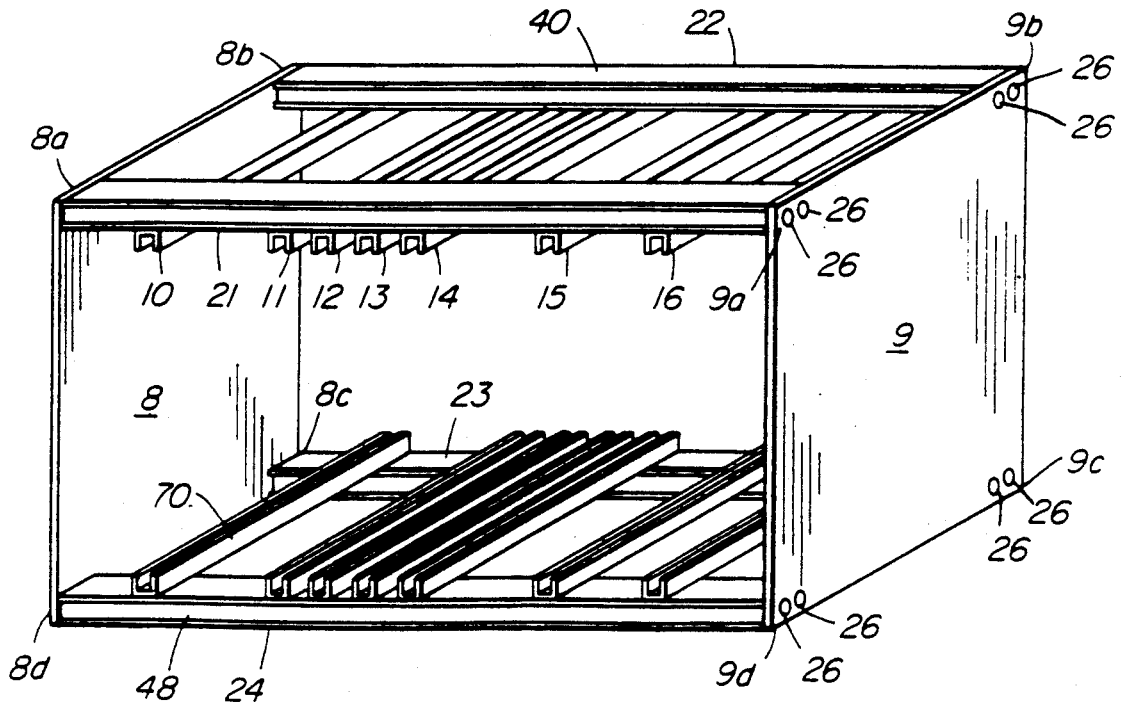
FIG. 3 is a simplified perspective view of an equipment shelf suitable for use in the system illustrated in FIGS. 1 and 2.
Figure 8A:
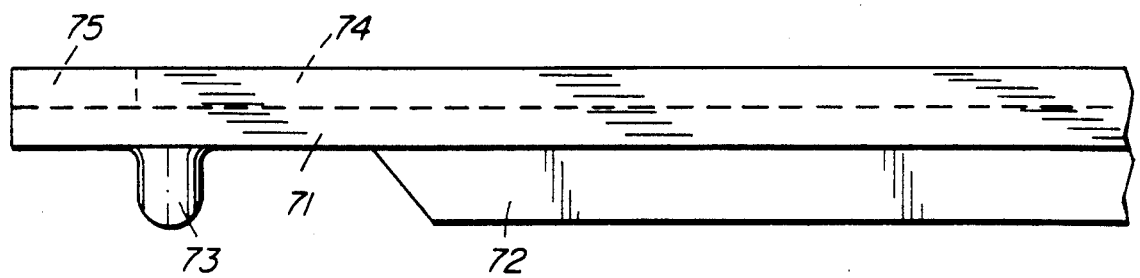
FIGS. 8a and 8b are partial side and plan views which illustrate one typical known form of card slider which is suitable for retention in the equipment shelf illustrated in FIG. 3 by fastening elements as illustrated in FIG. 5.
Figure 8B:
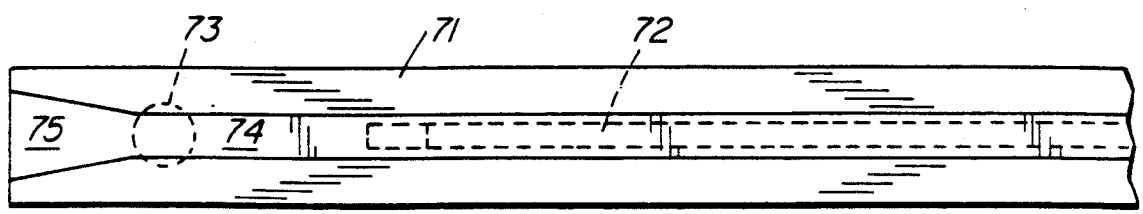

An example of a suitable equipment shelf, in accordance with the invention is that illustrated in FIG. 3. This equipment shelf includes first and second side panels 8 and 9 being fixed apart one from the other by elongated cross connecting members each having a body portion 40. Four of the elongated cross connecting members are disposed at locations 21, 22, 23, and 24, each being fastened by metal screws 26 between respective corners 8a-8d and 9a-9d of the side panels 8 and 9. As shown in FIG. 4c, each body portion 40 carries an elongated thin flat fastening strip 50, which includes holes 51 as exemplified in FIG. 5 for retaining slippery plastic card sliders 70 at card slide locations 10-16 indicated in FIG. 3. Referring to FIGS. 8a and 8b, each card slider 70 includes an elongated body portion 71 having a reinforcing rib 72 along a central portion thereof on one side, and on an opposite side having a groove 74 flared groove ends 75 formed therein. Each card slider includes a fastening projection 73 at each end thereof. The fastening projection 73 is intended to cooperate in an interference fitting engagement with mounting orifices in the equipment shelf.

In the past, one solution to providing equipment shelves with variable or adaptable spacing was to provide a multitude of closely spaced mounting orifices, similar to the holes 51, so that virtually any combinations of lateral spacing requirements could be provided for by selective placement of card sliders. However, it has been realized that this arrangement is prone to permitting misplaced installation of card sliders, and in some production line environments, has been found to encourage the thoughtless insertion of a card slider at every possible location. Such practice necessitates subsequent correction before circuit boards or units can be inserted into the system. Of course correction includes the removal of any misplaced card sliders from those locations where they had been fastened. Such insertion and subsequent removal is accompanied by wearing of the plastic material of the fastening projection 73 such that if the card slider were to be reused, at some other location, engagement of the fastening projection 73 with the mounting orifices in the equipment shelf, is of inconsistent interference and cannot be relied upon. Hence scrap disposal of any removed card sliders is preferably immediate to avoid any confusion between new and used card sliders as any reuse is a false economy. It has been realized that if the thin flat strip 50 is of a resilient plastic material that less insertion wear is experienced upon the insertion of a fastening projection 73 and the card sliders 70 will be more consistently fastened within the equipment shelf. One suitable plastic material for this purpose has been found to be polycarbonate, however other commonly known plastics of suitable resilient characteristics are available.

An alternate solution has been that of forming only the mounting orifices peculiar to the particular shelf, within the cross connecting members. However as previously discussed, this leads to a proliferation of specialized cross connecting member piece parts and consequent increased inventory expense. This expense can be substantially reduced by the use of a standardized cross connecting member as exemplified in the FIG. 4a-4c, that is a cross connecting member which is adapted to receive and retain an inexpensive elongated polycarbonate plastic strip 50 having mounting orifices 51 for fastening card sliders as exemplified in FIGS. 8a and 8b at laterally spaced locations peculiar to the particular equipment shelf. All the cross connecting members are identical and thus reduce the variance and expense of parts inventory. Cost is further reduced by the ease, and variability with which the resilient strips 50 can be produced.

Figure 4A:
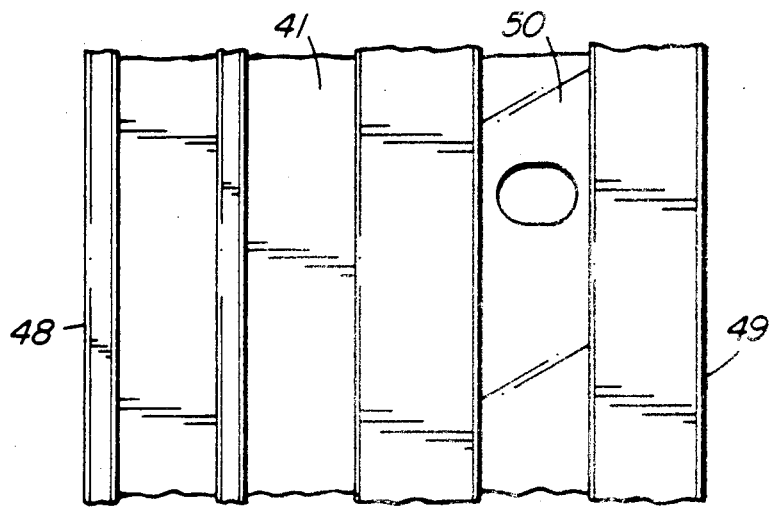
FIGS. 4a and 4c are first and second side fragmentary views and FIG. 4b is an end view, illustrating an elongated cross connect member in the equipment shelf in FIG. 3, in accordance with the invention.
Figure 4C:
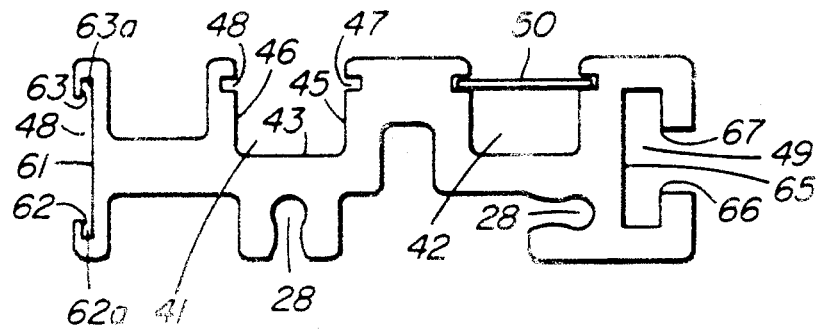
Figure 4B:
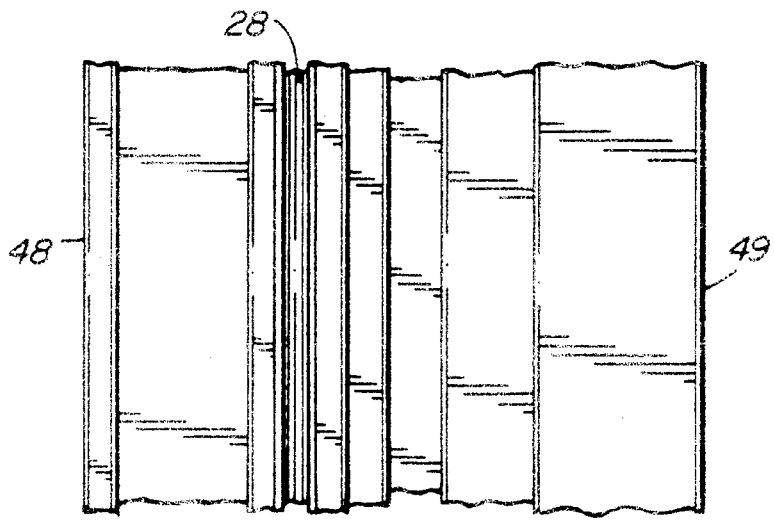
Figure 5:
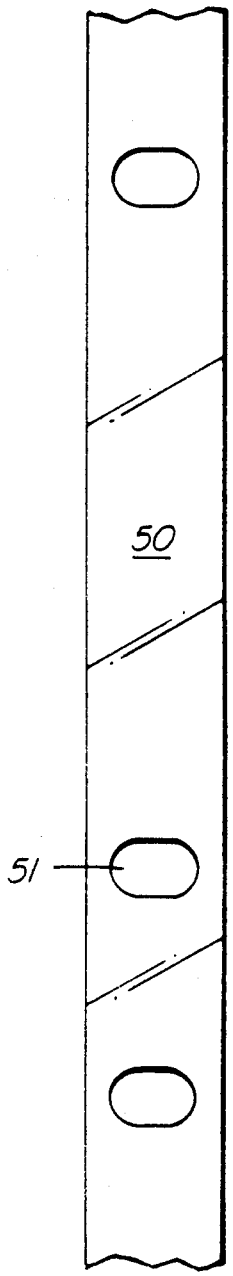
FIG. 5 is a partial plan view of a fastening element insertable in the elongated cross connect member illustrated in FIGS. 4a, 4b and 4c, for defining lateral spacing of circuit board positions as illustrated in FIG. 2, in accordance with the invention.

Referring to the FIGS. 4a-4c, the elongated cross connecting member is in the form of an aluminum extrusion having a body portion cut to a predetermined length corresponding to the distance between the side panels 8 and 9. Longitudinal channels 41 and 42 extend along a side of the body portion and are each defined by a pair of side surfaces 45 and 46 being connected by a bottom surface 43. The side surface 45 includes a groove 47 therein and the side surface 46 includes a similar groove 48 therein. Each of the grooves 47 and 48 is spaced a predetermined distance from the bottom surface 43 for slidably receiving a longitudinal edge of a card slide retaining strip 50. In this example, the cross connecting member illustrated includes a front surface formation 48 which is adapted to holding a strip of material convenient for carrying identification information as to placement of circuit units in the system and a groove 48a provides for a convenient engagement with a circuit unit latching lever. The cross connecting member also includes a rear surface formation 49 which is adapted to carrying a threaded fastener, a nut or the like, as convenient for fastening a back plane assembly for example to the rear side of the equipment shelf. Specifically, the front surface formation 48 includes a flat front surface 61 which is longitudinally bounded by inward facing terminating edges 62 and 63, being coupled thereto by connecting surfaces 62a and 63a, each of which effects an angular placement of the terminating edges 62 and 63 of about 180 degrees with respect to the flat front surface 61. The rear surface formation 49 includes a flat rear face 65 which is longitudinally bounded by inward facing terminating edges 66 and 67 coupled thereto by connecting surfaces 66a and 67a, each of which effects an angular placement of the terminating edges 66 and 67 of about 180 degrees with respect to the flat rear surface 65. Another side of the body portion includes longitudinal channels 28, as shown, which are dimensioned to receive metal screws 26.

Figure 6:
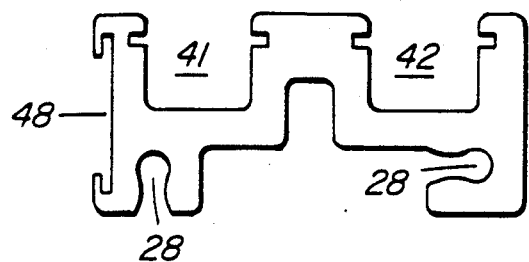
FIGS. 6 and 7 are end views of alternate examples of the elongated cross connect member illustrated in FIGS. 4a, 4b and 4c.
Figure 7:
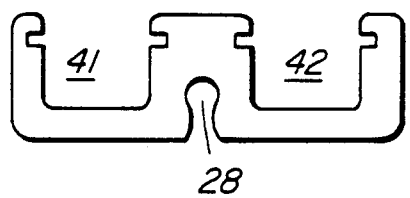

As before mentioned, FIGS. 6 and 7 are end views of alternate examples of the elongated cross connect member illustrated in the FIGS. 4a–4c. Similar aspects in these examples are identified by labels corresponding to those in the FIGS. 4a–4b.

Figure 9A:
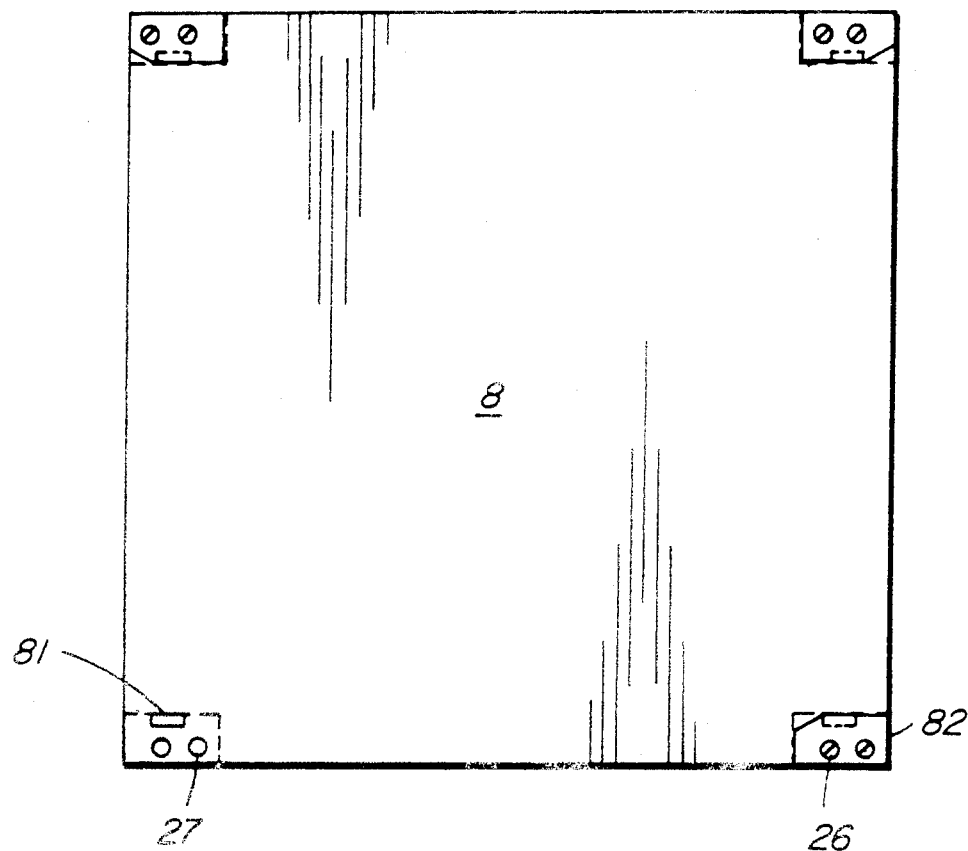
FIG. 9a is a side view of the equipment shelf in FIG. 3, illustrating a variation of the example embodiment in accordance with the invention.
Figure 9B:
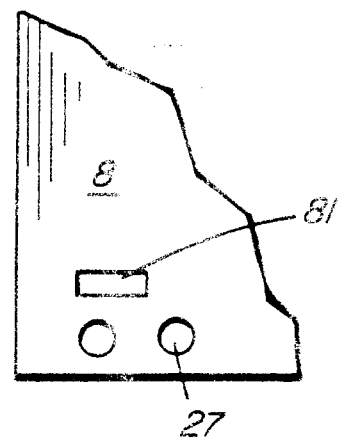

In view of the structure and function of an example equipment shelf discussed in the foregoing, it may now be realized that during the process of assembly, but before the equipment shelf is installed into a system, an erroneously placed strip 50 may be readily removed and replaced by simply removing one of the panels 8 or 9, withdrawing the improper strip, inserting the required strip, and replacing the panel. This advantage may be extended, as illustrated in FIG. 9a and 9b, to rendering frame mounted equipment shelves alterable by providing escape passages 81 in the side panels 8 and 9 by which corresponding strips 50 in the assembly may be withdrawn or replaced. However, such modification also requires some element to effectively close the escape passage as in this example is the function of a plate 82 illustrated as being retained by a pair of the metal screws 26, being fastened through screw holes shown at 27.

I claim:

1. An equipment shelf, for mounting a plurality of board sliders for removably retaining circuit boards, whereby a plurality of circuit boards may be slidably inserted into a system, comprising:

fastening means for fixedly engaging the plurality of board sliders, each fastening means being an elongated flat strip and each strip defining a plurality of fastening locations;

a plurality of elongated cross connecting members each member including a body portion terminating at first an second ends and retaining means, in the body portion, for retaining one of the fastening means, wherein the retaining means in each of the elongated cross connecting members includes a first longitudinal channel extending along a side of the body portion between the first and second ends, and being defined by a pair of side surfaces being connected by a bottom surface, each of the pair of side surfaces having a groove therein being spaced a predetermined distance from the bottom surface, for slidably receiving a longitudinal edge of one of said plurality of elongated flat strips;

first and second side panels, being spaced apart by the plurality of elongated cross connecting members, one pair of which are fixed at said first ends to the first side panel along a first line and at said second ends to the second side panel along a line similar to the first line, and another pair of which are fixed at said first ends to the first side panel along a second line spaced apart from the first line and are fixed at said second ends to the second side panel along a line similar to the second line;

whereby lateral spacing of circuit board positions in the equipment self are defined by the relative location of each fastening location in said plurality of elongated flat strips.

2. An equipment shelf as defined in claim 1 wherein each of the side panels includes front, rear, top and bottom edges, wherein each of the elongated cross connecting members includes front and rear surfaces and wherein the front surface of one of the one pair and the front surface of one of the other pair are each fixed next to the front edges, and the rear surface of the other of the one pair and the rear surface of the other of the other pair are each fixed adjacent the rear edges.

3. An equipment shelf as defined in claim 1 wherein each of the elongated cross connecting members includes a plurality of the retaining means, each retaining means being spaced from another along one side of the body portion and each for retaining one of said plurality of elongated flat strips.

4. An equipment shelf as defined in claim 1 wherein each of the elongated cross connecting members includes front and rear surfaces, one of which is longitudinally bounded by inward facing terminating edges coupled thereto by connecting surfaces defining an angular placement of more than 90 degrees with respect to the one of said front and rear surfaces.

5. An equipment shelf as defined in claim 2 wherein each of the elongated cross connecting members includes a plurality of retaining means, each retaining means being spaced from another along one side of the body portion and each for retaining one of said plurality of elongated flat strips.

6. An equipment shelf as defined in claim 2 wherein each of the elongated cross connecting members includes front and rear surfaces, one of which is longitudinally bounded by inward facing terminating edges coupled thereto by connecting surfaces defining an angular placement of more than 90 degrees with respect to the one of said front and rear surfaces.

7. An equipment shelf as defined in any one of claims 1, 2, 3, 4, 5 and 6 wherein the elongated flat strip is bounded by edges including a pair of parallel longitudinal edges and defines a plurality of fastening locations being arranged in a row between said longitudinal edges and being separated, one from the other.

8. An equipment shelf as defined in any one of claims 1, 2, 3, 4, 5 and 6 wherein the elongated flat strip is bounded by edges including a pair of parallel longitudinal edges and defines a plurality of orifices being arranged in a row between said longitudinal edges and being separated one from the other, each of said orifices being of an interference fit dimension with respect to each of a plurality of attachment projections extending from one side of each of the card slides.

9. An equipment shelf as defined in claim 1 wherein one of said side panels includes an opening being defined therein adjacent each of the cross connecting members, whereby after assembly of the shelf any of said fastening means may be inserted and removed.

10. An equipment shelf, for removably retaining a plurality of circuit boards in a system, the equipment shelf comprising:

a plurality of board slides, each board slide including an elongated body with a groove in one side thereof for receiving an edge of a circuit board and a plurality of attachment projections extending from another side thereof, the board slides being grouped in pairs, each pair of board slides being for slidably engaging opposite edges of one of the plurality of circuit boards;

fastening means for fixedly engaging the plurality of board slides, each of the fastening means including an elongated flat strip, being bounded by edges including a pair of parallel longitudinal edges, and defining a plurality of orifices arranged in a row between said longitudinal edges and being separated one from the other by a predetermined amount, each of said orifices being of an interference fit dimension for retaining one of the attachment projections therein;

a plurality of elongated cross connecting members each member including a body portion terminating at first and second ends and a plurality of retaining means, each of the retaining means including a longitudinal channel extending along a side of the body portion between the first and second ends, and being defined by a pair of side surfaces being connected by a bottom surface, each of the pair of side surfaces having a groove therein being spaced a predetermined distance from the bottom surface, for slidably receiving a longitudinal edge of one of said fastening means;

first and second side panels being spaced apart by the plurality of elongated cross connecting members, one pair of which are fixed at said first ends to the first side panel along a first line and at said second ends to the second side panel along a line similar to the first line, and another pair of which are fixed at said first ends to the first side panel along a second line spaced apart from the first line and are fixed at said second ends to the second side panel along a line similar to the second line;

whereby circuit board positions in the equipment shelf are selectably determined by the arrangement of orifices in the respective flat strips.

* * * * *